(12) United States Patent
Klinghult et al.

(10) Patent No.: US 10,782,324 B2
(45) Date of Patent: Sep. 22, 2020

(54) DEVICE AND METHOD FOR MEASURING ELECTRICAL CURRENT IN AN ELECTRICAL CONDUCTOR

(71) Applicant: Qoitech AB, Lund (SE)

(72) Inventors: Gunnar Klinghult, Lund (SE); Björn Rosqvist, Lund (SE); Kåre Agardh, Rydebäck (SE)

(73) Assignee: QOITECH AB, Lund (SE)

( * ) Notice: Subject to any disclaimer, the term of this patent is extended or adjusted under 35 U.S.C. 154(b) by 42 days.

(21) Appl. No.: 16/326,240

(22) PCT Filed: Oct. 21, 2016

(86) PCT No.: PCT/IB2016/056323
§ 371 (c)(1),
(2) Date: Feb. 18, 2019

(87) PCT Pub. No.: WO2018/073627
PCT Pub. Date: Apr. 26, 2018

(65) Prior Publication Data
US 2019/0212373 A1 Jul. 11, 2019

(51) Int. Cl.
*G01R 19/25* (2006.01)
*G01R 1/20* (2006.01)
(Continued)

(52) U.S. Cl.
CPC ......... *G01R 19/2509* (2013.01); *G01R 1/203* (2013.01); *G01R 15/146* (2013.01);
(Continued)

(58) Field of Classification Search
CPC .................................................. G01R 19/0007
See application file for complete search history.

(56) References Cited

U.S. PATENT DOCUMENTS 5,477,135 A  12/1995  Baker
9,689,900 B1 * 6/2017 Chikamatsu ......... G01R 15/146
(Continued)

FOREIGN PATENT DOCUMENTS

EP  3179258 A1 * 6/2017 ......... G01R 19/0092
JP  2004205264 A  7/2004
(Continued)

OTHER PUBLICATIONS

International Search Report and Written Opinion from corresponding International Patent Application No. PCT/IB2016/056323, dated Aug. 21, 2017.

*Primary Examiner* — Christopher E Mahoney
(74) *Attorney, Agent, or Firm* — Tucker Ellis LLP

(57) ABSTRACT

The disclosure relates to a device for measuring electrical current in an electrical conductor (2), the device comprising: a measuring circuit configured to be connected to the electrical conductor, the measuring circuit comprising: a resistor based measuring circuit comprising a resistor (10), a transformer based measuring circuit comprising a current transformer (20) comprising a primary coil (20a), connected in series with the resistor (10) of the resistor based measuring circuit, a first inverter (12) configured to transform a first digital signal using a transfer function being an inverse of a transfer function representing the resistor based measuring circuit; a second inverter (22) configured to transform a second digital signal using a transfer function being an inverse of a transfer function representing the transformer based measuring circuits; and a signal combiner (5) configured to combine the transformed first and second digital signals, thereby providing a digital signal representing the electrical current in the electrical conductor. The disclosure also relates to a method for measuring electrical current in an electrical conductor.

8 Claims, 3 Drawing Sheets

(51) Int. Cl.
*G01R 15/18* (2006.01)
*G01R 19/00* (2006.01)
*G01R 15/14* (2006.01)

(52) U.S. Cl.
CPC ......... *G01R 15/18* (2013.01); *G01R 19/0007* (2013.01); *G01R 19/0015* (2013.01); *G01R 19/0092* (2013.01); *G01R 19/25* (2013.01)

(56) References Cited

U.S. PATENT DOCUMENTS

| | | | |
|---|---|---|---|
| 2006/0170432 A1 | 8/2006 | Adolsson | |
| 2006/0232264 A1* | 10/2006 | Jurisch | G01R 15/16 324/142 |
| 2018/0172735 A1* | 6/2018 | Arai | H01C 1/04 |

FOREIGN PATENT DOCUMENTS

| | | |
|---|---|---|
| JP | 2011038964 A | 2/2011 |
| JP | 2015014525 A | 1/2015 |

* cited by examiner

DEVICE AND METHOD FOR MEASURING ELECTRICAL CURRENT IN AN ELECTRICAL CONDUCTOR

FIELD OF INVENTION

The invention relates to a device for measuring electrical current in an electrical conductor.

The invention relates to a method for measuring electrical current in an electrical conductor.

TECHNICAL BACKGROUND

When designing electrical apparatuses more and more focus is put on saving energy and prolonging battery life. The sheer number of devices anticipated in the so-called Internet of Things makes this focus even more motivated, since they together will consume large amounts of power. It is expected that in a couple of years many billions of devices will be active and connected to communications networks; all powered by some kind of power supply. If these devices are not optimized and energy consumption is not considered during hardware and software design, vast amounts of energy will be wasted.

One of the issues encountered by those who work with development and design of cost efficient and well performing measurement systems, is that the apparatuses whose energy consumption is to be measured and optimized often uses small amounts of energy over time, in e.g. standby mode, and uses energy in short bursts of significantly larger levels of energy consumption when performing a specific task.

Thus the measurements system needs to be able to detect and measure very short bursts of energy consumption while maintaining good accuracy on steady-state levels or otherwise the measurements will not give accurate data for actually making it possible to optimize the design of the apparatuses.

In FIG. 1 there is disclosed a prior art measurement set-up comprising a resistor, an amplifier and an Analog-to-Digital converter. A current over the resistor will result in a voltage drop over the resistor. This voltage drop corresponds to the current via Ohm's law (I=U/R). The voltage drop is measured and amplified by an amplifier. This amplified measurement is fed into an Analog-to-digital converter that takes a sample and converts it to a digital signal. The more of these samples that can be collected over a given time period, the faster current peaks can be measured and the better accuracy and/or resolution is achieved. However, the higher sample rate of the Analog-to-Digital converter, the higher is the price.

Also, the larger the resistance, the smaller currents can be detected. However, if the resistance is large, the voltage drop will be high and the maximum current will be limited which means that the amplitude of high current peaks will not be possible to measure.

To be able to measure both very low currents, such as idle or standby currents of below 1 μA, and high current peaks, such as the several amperes typically occurring at the transmitting phase in e.g. a mobile phone, the system must be able to handle a very high dynamic range with precision. The high dynamic range implies, with the above setup using a resistor and amplifier, a need for high performance requirement on the components in the system. The amplifier need to have extremely high linearity and be associated with low noise and low drift, etc. The resistors need to have e.g. precision values for tolerances and temperature coefficient. The Analog-to-Digital converter need to have a high sample rate, extremely high linearity, low drift and high dynamic range etc. Such performance specifications are however very costly.

Thus, there is a need for a solution to the problem of being able to detect and measure, over a high dynamic range, both short bursts and steady-state levels of energy consumption.

SUMMARY OF INVENTION

It is an object of the invention to provide a solution to the problem of being able to detect and measure, over a high dynamic range, both short bursts and steady-state levels of energy consumption.

This object has been achieved by a device for measuring electrical current in an electrical conductor, the device comprising:

a measuring circuit configured to be connected to the electrical conductor, the measuring circuit comprising:
a resistor based measuring circuit comprising:
a resistor,
a first amplifier connected to the resistor for measuring and
amplifying a voltage drop over the resistor corresponding to a direct current component of the electrical current in the electrical conductor, and
a first Analog-to-Digital Converter configured to sample and convert the measured and amplified voltage drop to a first digital signal representing the direct current component of the electrical current in the electrical conductor; and
a transformer based measuring circuit comprising:
a current transformer comprising a primary coil, connected in series with the resistor of the resistor based measuring circuit, and a secondary coil,
a second amplifier connected to the secondary coil for measuring and amplifying voltage pulses over the secondary coil representing an alternating current component of the electrical current in the electrical conductor, and
a second Analog-to-Digital Converter configured to sample and convert the measured and amplified voltage pulses to a second digital signal representing the alternating current component of the electrical current in the electrical conductor;
a first inverter configured to transform the first digital signal using a transfer function being an inverse of a transfer function representing the resistor based measuring circuit;
a second inverter configured to transform the second digital signal using a transfer function being an inverse of a transfer function representing the transformer based measuring circuits; and
a signal combiner configured to combine the transformed first and second digital signals, thereby providing a digital signal representing the electrical current in the electrical conductor.

Such a device is able to quantify and report signals with high bandwidth by aggregation of bandwidth dependent hardware elements. Such a device will provide much improved performance at very little cost and complexity by benefiting from insightful electronics combined with mixing in hardware or software.

The resistor based measuring circuit will be able to provide a well-defined and consistent measurement in respect of the continuous signal or continuous current consumption, sometimes referred to as the DC-signal (Direct Current-signal). As is understood by the person skilled in the art the so called DC-signal also comprises low frequency AC components. The current over the resistor will result in a voltage drop over the resistor. This voltage drop corresponds to the current via Ohm's law (I=U/R). The voltage drop is measured and amplified by an amplifier. This amplified measurement is fed into an Analog-to-digital converter that takes a sample and converts it to a digital signal. The resistor based measuring circuit may be expressed as a transfer function.

The transformer based measuring circuit will be able to provide a well-defined and consistent measurement in respect of the change in current which will be a transient signal representing short bursts of current consumption. This is sometimes referred to as the AC-signal (Alternating Current-signal). The current pulse in the primary winding or primary coil will create a magnetic field that will create a voltage pulse over the secondary winding or secondary coil. This voltage will be measured using an amplifier and sampled with an AD converter. The value determined indicates the amount of energy transferred in frequencies higher than 0 Hz.

The actual frequency response of such measurement circuit will e.g. depend on the ratio of primary and secondary coil windings in the inductor and the magnetic material used in the transformer. The ratio between the number of windings in the primary coil and the number of windings in the secondary coil of the transformer will e.g. determine the output voltage for a given current pulse. The transformer based measuring circuit may be expressed as a transfer function.

By inverting the first signal in a first inverter and the second signal in a second inverter using the respective inverse to the respective transfer function and by thereafter combining the signals, it is possible to provide a digital signal accurately representing the electrical current in the electrical conductor over a high dynamic range using components that are comparably cheap. The set-up with a resistor based measurement circuit and a transformer based measurement circuit makes it possible to get the physical information about the current over a high dynamic range in a cost effective manner. The set-up with the inverters and the combination of the thus inverted signals makes it possible to provide a single signal providing a useful representation of the current over a high dynamic range.

The voltage drop due to the DC current over the transformer may be very low as the primary winding can have very low resistance. This makes it possible to measure high current peaks without high DC losses. By increasing the turn ratio of the transformer it will also be possible to measure very small current peaks superimposed on a high DC current.

The signal after the combining of the inverted signals will be a good approximation of the original signal, where the DC parts is collected by the resistive sampling system (DC signal) and the higher frequencies are collected by the inductive sampling systems (AC signal).

The transfer function of the resistor based measuring circuit may be measured for the actual resistor based measuring circuit. Alternatively or in combination, the transfer function of the resistor based measuring circuit may be measured for an exemplified resistor based measuring circuit and thereafter be used for the actual resistor based measuring circuit. The transfer function of the transformer based measuring circuit may be measured for the actual transformer based measuring circuit. Alternatively or in combination, the transfer function of the transformer based measuring circuit may be measured for an exemplified transformer based measuring circuit and thereafter be used for the actual transformer based measuring circuit. The transfer function for an arbitrary circuit may be measured using a transfer function measuring apparatus well known to the person skilled in the art. The transfer function measuring apparatus may be hardware and/or software based.

Preferred embodiments appear in the dependent claims and in the description.

The resistance in the resistor of the resistor based measuring circuit may be within the range of 10 $\mu\Omega$-100$\Omega$, preferably within 10 $\mu\Omega$-10$\Omega$. This is considered appropriate to be able to provide a suitable response to the direct current component. An advantage with using the present measuring circuit comprising both the resistor based measuring circuit and the transformer based measuring circuit is that the resistance in the resistor of the resistor based measuring circuit may be kept reasonably low so that the resistor is not adversely affecting the total circuitry.

The second amplifier may be a transimpedance amplifier. The second amplifier may be a non-inverting amplifier. These are considered appropriate alternatives in performing the task of the transformer based measuring circuit.

The measuring circuit may comprise a plurality of transformer based measuring circuits, wherein the primary coils of the current transformers of the plurality of transformer based measuring circuits and the resistor of the resistor based measuring circuit are connected in series, and wherein the current transformers of the different transformer based measuring circuits have different coil winding ratios and/or transformer cores having different magnetic properties. This way the different transformer based measuring circuits may be designed to provide a response in respect of different dynamic properties of the current and/or different frequencies of the current. This may be used to further improve the possibility to accurately measure currents over an even higher dynamic range still using relatively cheap equipment. The greater number of transformer based measuring circuits, the greater dynamic range may be accurately measured. However, the greater number of transformer based measuring circuits, the greater cost. Thus, the number of transformer based measuring circuits depends on the cost and dynamic range of respective transformer based measuring circuit in relation to the actual dynamic range and measurement accuracy demanded. With a greater number of transformer based measuring circuits a better spectral content of the current signal is possible to determine. If the spectral content is well known, it is possible to reproduce or estimate the total energy transferred with a good accuracy.

The combination function (combined output) may be performed in software on a host system that receives Analog-to-Digital converted samples, aligns, combines and presents the composite signals to other parts of the system. This will give benefits such as different weighing of the signals as well as adding calculations and methods (such as dynamic filtering etc) on the signals to improve the end result. This combination will allow for high dynamic range measurements, i.e. DC current will not be limited, while peaks and high amplitude currents also may be detected.

In short the invention may also be said to relate to a device for measuring electrical current in an electrical conductor, the device comprising:

a measuring circuit configured to be connected to the electrical conductor, the measuring circuit comprising:

a resistor based measuring circuit comprising a resistor, a transformer based measuring circuit comprising a current transformer comprising a primary coil, connected in series with the resistor of the resistor based measuring circuit, a first inverter configured to transform a first digital signal using a transfer function being an inverse of a transfer function representing the resistor based measuring circuit;

a second inverter configured to transform a second digital signal using a transfer function being an inverse of a transfer function representing the transformer based measuring circuits; and a signal combiner configured to combine the transformed first and second digital signals, thereby providing a digital signal representing the electrical current in the electrical conductor.

The above object has also been achieved by a method for measuring electrical current in an electrical conductor, the method comprising:

connecting a measuring circuit to the electrical conductor, the measuring circuit comprising a resistor based measuring circuit and a transformer based measuring circuit, wherein the resistor based measuring circuit comprises a resistor, a first amplifier connected to the resistor for measuring and amplifying a voltage drop over the resistor corresponding to a direct current component of the electrical current in the electrical conductor, and a first Analog-to-Digital Converter configured to sample and convert the measured and amplified voltage drop to a first digital signal representing the direct current component of the electrical current in the electrical conductor, wherein transformer based measuring circuit comprises a current transformer comprising a primary coil, connected in series with the resistor of the resistor based measuring circuit, and a secondary coil, a second amplifier connected to the secondary coil for measuring and amplifying voltage pulses over the secondary coil representing an alternating current component of the electrical current in the electrical conductor, and a second Analog-to-Digital Converter configured to sample and convert the measured and amplified voltage pulses to a second digital signal representing the alternating current component of the electrical current in the electrical conductor, transforming the first digital signal using a first inverter configured to transform the first digital signal using a transfer function being an inverse of a transfer function representing the resistor based measuring circuit;

transforming the second digital signal using a second inverter configured to transform the second digital signal using a transfer function being an inverse of a transfer function representing the transformer based measuring circuit;

combining the transformed first and second digital signals, thereby providing a digital signal representing the electrical current in the electrical conductor. It goes without saying that the transforming of the first and second digital signal is performed in the digital domain.

The advantages and the effects of the different features have been discussed above in relation to the corresponding features of the device and corresponding advantages and the effects of the different features are applicable also in respect of the method above.

Preferred embodiments appear in the dependent claims and in the description.

The measuring circuit may as mentioned above comprise a plurality of transformer based measuring circuits, wherein the primary coils of the current transformers of the plurality of transformer based measuring circuits and the resistor of the resistor based measuring circuit are connected in series, and wherein the current transformers of the different transformer based measuring circuits have different coil winding ratios and/or transformer cores having different magnetic properties;

wherein the act of transforming the second digital signal comprises transforming each of the plurality of second digital signals originating from the respective transformer based measuring circuits using a respective second inverter configured to transform the respective second digital signal using a transfer function being an inverse of a transfer function representing the respective transformer based measuring circuit; and wherein the act of combining comprises combining the transformed first digital signal and the transformed plurality of second digital signals, thereby providing a digital signal representing the electrical current in the electrical conductor.

BRIEF DESCRIPTION OF THE DRAWINGS

The invention will by way of example be described in more detail with reference to the appended schematic drawings, which shows a presently preferred embodiment of the invention.

DETAILED DESCRIPTION OF PREFERRED EMBODIMENTS

Figure 1:
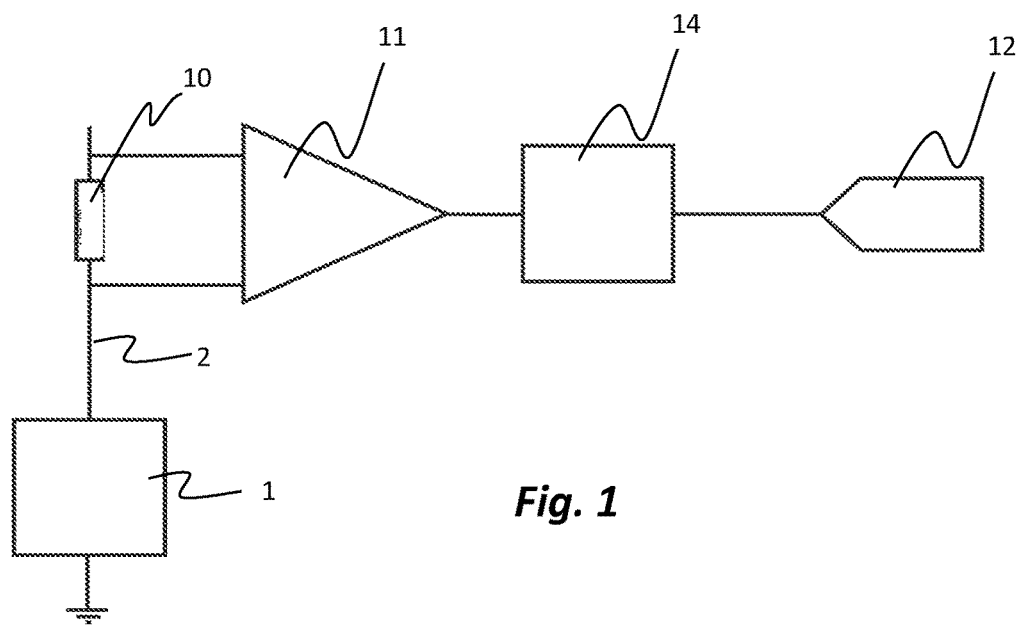
FIG. 1 schematically shows a prior art measurement system.
Figure 2:
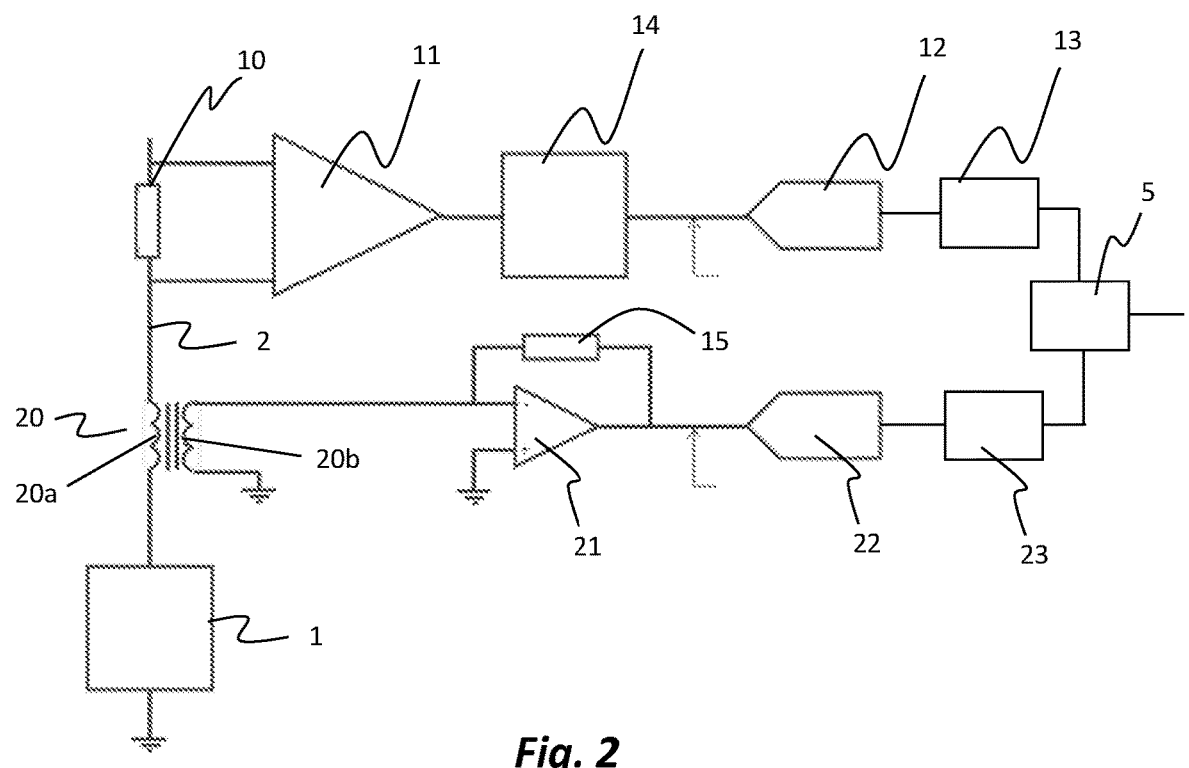
FIG. 2 schematically shows a measurement system comprising a resistor based measuring circuit and a transformer based measuring circuit.
Figure 3:
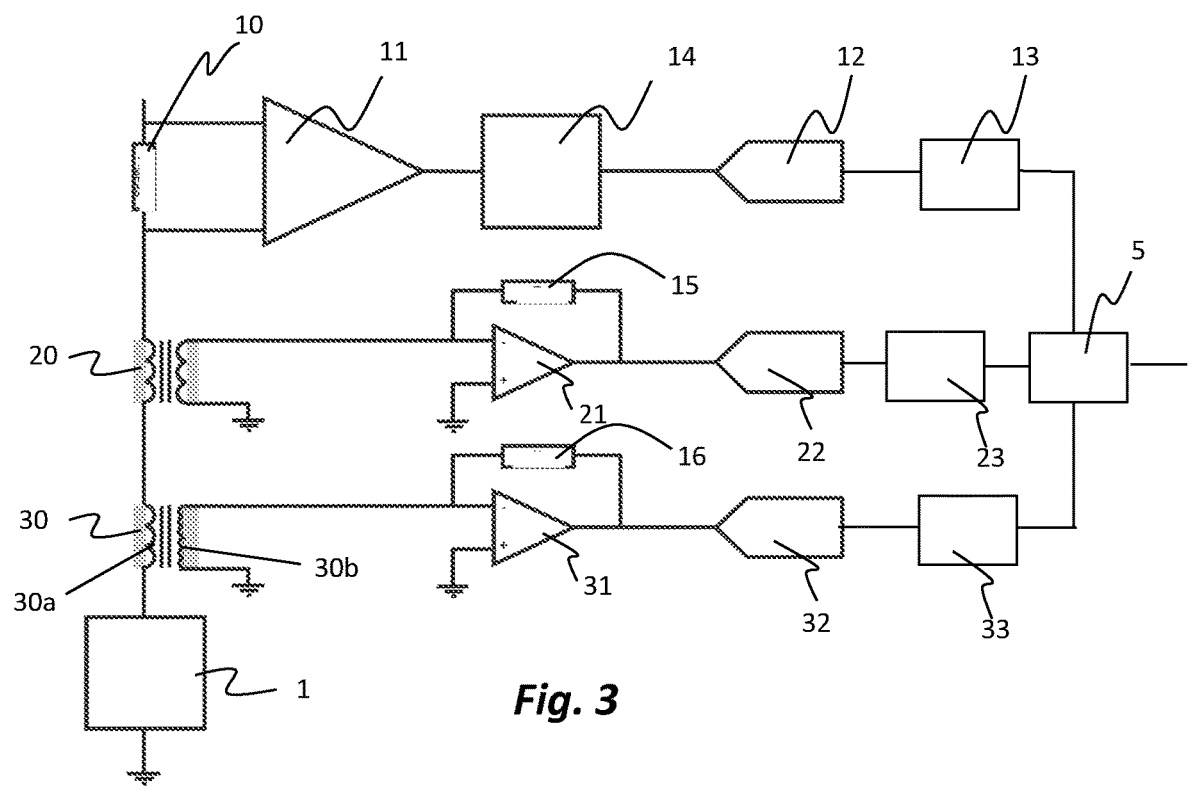
FIG. 3 schematically shows a measurement system comprising a resistor based measuring circuit and two transformer based measuring circuit.

FIGS. 1-3 schematically shows a measurement system adapted to be connected to a generic device 1 for measurement of a current in an electrical conductor 2 connected to the generic device 1. The electrical conductor 2 may be basically any conductor in which it is considered relevant to determine the current. The electrical conductor 2 may e.g. be connected between the generic device 1 and a power source.

FIG. 1 schematically shows a prior art measurement system. The system comprises a resistor 10, an amplifier 11 connected to the resistor 10 for measuring and amplifying a voltage drop over the resistor 10 corresponding to the electrical current in the electrical conductor 2, and an Analog-to-Digital Converter 12 configured to sample and convert the measured and amplified voltage drop to a digital signal representing the electrical current in the electrical conductor 2. The voltage drop corresponds to the current via Ohm's law (I=U/R).

FIG. 2 schematically shows a device for measuring electrical current in an electrical conductor 2.

The device comprises a measuring circuit configured to be connected to the electrical conductor 2. The measuring circuit comprises a resistor 10 based measuring circuit and a transformer 20 based measuring circuit.

The resistor based measuring circuit comprises a resistor 10, a first amplifier 11 connected to the resistor 10 for measuring and amplifying a voltage drop over the resistor 10 corresponding to a direct current component of the electrical current in the electrical conductor 2, and a first Analog-to-Digital Converter 12 configured to sample and convert the measured and amplified voltage drop to a first digital signal representing the direct current component of the electrical current in the electrical conductor 2.

The transformer based measuring circuit comprises a current transformer 20 comprising a primary coil 20a, connected in series with the resistor 10 of the resistor based measuring circuit, and a secondary coil 20b, a second amplifier 21 connected to the secondary coil 20b for measuring and amplifying voltage pulses over the secondary coil 20b representing an alternating current component of the electrical current in the electrical conductor 2, and a second Analog-to-Digital Converter 22 configured to sample and convert the measured and amplified voltage pulses to a second digital signal representing the alternating current component of the electrical current in the electrical conductor 2.

The measuring circuit further comprises a first inverter 13 and a second inverter 23.

The first inverter 13 is configured to transform the first digital signal using a transfer function being an inverse of a transfer function representing the resistor based measuring circuit. The transfer function of the resistor based measuring circuit may be measured for the actual resistor based measuring circuit. Alternatively or in combination, the transfer function of the resistor based measuring circuit may be measured for an exemplified resistor based measuring circuit and thereafter be used for the actual resistor based measuring circuit. Having determined the transfer function for the resistor based measuring circuit the inverse of the transfer function may be determined.

The second inverter 23 is configured to transform the second digital signal using a transfer function being an inverse of a transfer function representing the transformer based measuring circuits. The transfer function of the transformer based measuring circuit may be measured for the actual transformer based measuring circuit. Alternatively or in combination, the transfer function of the transformer based measuring circuit may be measured for an exemplified transformer based measuring circuit and thereafter be used for the actual transformer based measuring circuit. Having determined the transfer function for the transformer based measuring circuit the inverse of the transfer function may be determined.

The transfer function for an arbitrary circuit may be measured using a transfer function measuring apparatus well known to the person skilled in the art. The transfer function measuring apparatus may be hardware and/or software based.

The measuring circuit further comprises a signal combiner 5 configured to combine the transformed first and second digital signals. The signal produced in the signal combiner is a digital signal representing the electrical current in the electrical conductor 2.

The resistance R in the resistor 10 of the resistor based measuring circuit is within the range of 10 µΩ-100Ω, preferably within 10 µΩ-10Ω.

Figure 4:
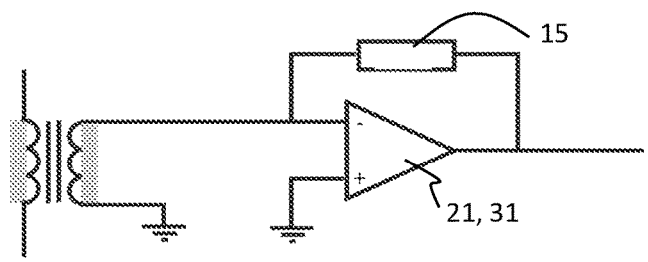
FIG. 4 schematically shows an alternative design of a transformer based measuring circuit.
Figure 5:
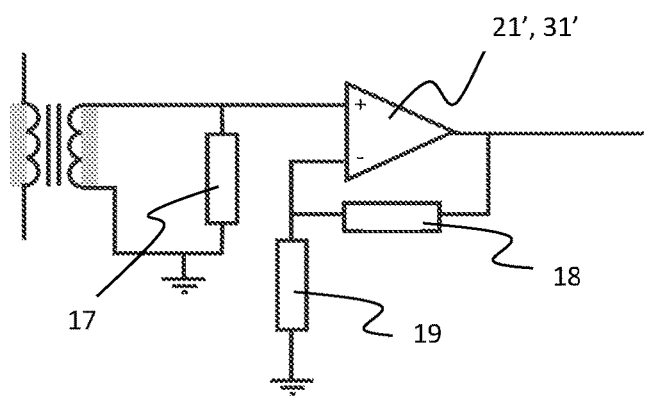
FIG. 5 schematically shows an alternative design of a transformer based measuring circuit.

The second amplifier 21, 31 is in FIGS. 2 and 3 a so-called transimpedance amplifier 21, 31. However, the second amplifier may alternatively be a so-called a non-inverting amplifier 21', 31' (as shown in FIG. 5). For reasons of clarity, the transimpedance amplifier 21, 31 is shown separately in FIG. 4.

As shown in FIG. 3, the measuring circuit may comprise a plurality of transformer based measuring circuits. In the embodiment shown in FIG. 3, there is provided two transformer based measuring circuits. The primary coils 20a, 30a of the current transformers 20, 30 of the plurality of transformer based measuring circuits and the resistor 10 of the resistor based measuring circuit are connected in series.

The current transformers 20, 30 of the different transformer based measuring circuits have different coil winding ratios and/or transformer cores having different magnetic properties. The coil winding ratio may e.g. be ratio between the number of windings in the primary coil 20a, 30a relative to the number of windings in the secondary coil 20b, 30b.

In FIGS. 2-5, there is also provided resistors 15, 16, 17, 18, 19 of different resistances adapted to limit the current in the measuring circuits.

Figure 6:
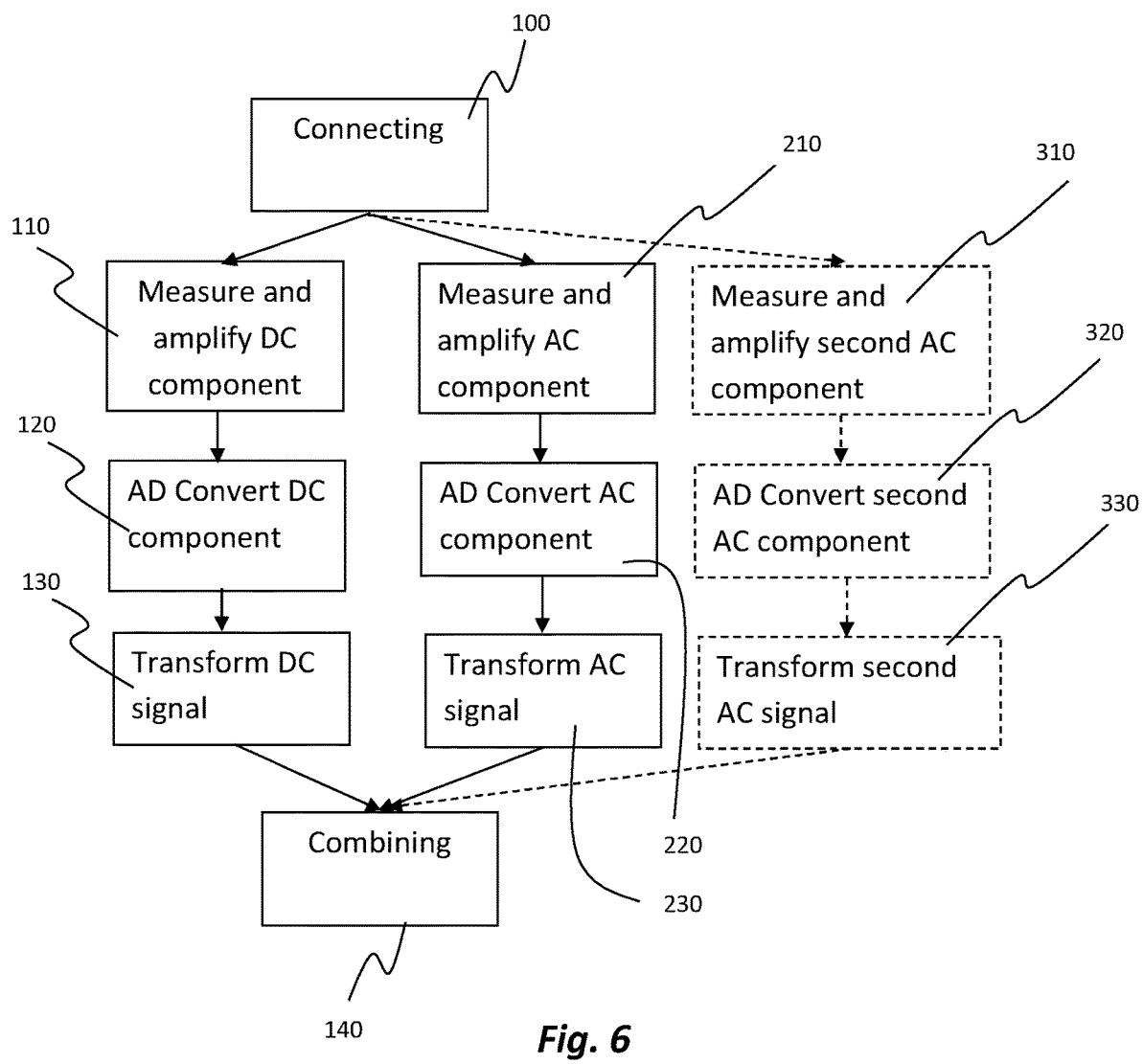
FIG. 6 schematically shows a method of measuring a current.

In FIG. 6 there is schematically shown a method for measuring electrical current in an electrical conductor 2. The method comprises:

connecting 100 a measuring circuit to the electrical conductor 2, the measuring circuit comprising a resistor based measuring circuit and a transformer based measuring circuit.

In the resistor based measuring circuit a first amplifier 11 connected to the resistor 10 measures and amplifies in step 110 a voltage drop over the resistor 10 corresponding to a direct current component of the electrical current in the electrical conductor 2.

In step 120 a first Analog-to-Digital Converter 12 samples and converts the measured and amplified voltage drop to a first digital signal representing the direct current component of the electrical current in the electrical conductor 2.

In step 130, the first digital signal is transformed using a first inverter 13 configured to transform the first digital signal using a transfer function being an inverse of a transfer function representing the resistor based measuring circuit.

The transformer based measuring circuit comprises a current transformer 20 comprising a primary coil 20a, connected in series with the resistor 10 of the resistor based measuring circuit, and a secondary coil 20b. In the transformer based measuring circuit, a second amplifier 21 connected to the secondary coil 20b measures and amplifies in step 210 voltage pulses over the secondary coil 20b representing an alternating current component of the electrical current in the electrical conductor 2.

In step 220 a second Analog-to-Digital Converter 22 samples and converts the measured and amplified voltage pulses to a second digital signal representing the alternating current component of the electrical current in the electrical conductor 2.

In step 230 the second digital signal is transformed using a second inverter 23 configured to transform the second digital signal using a transfer function being an inverse of a transfer function representing the transformer based measuring circuit.

In step 140, the transformed first and second digital signals are combined, thereby providing a digital signal representing the electrical current in the electrical conductor.

The measuring circuit may as mentioned above comprise a plurality of transformer based measuring circuits, wherein the primary coils of the current transformers of the plurality of transformer based measuring circuits and the resistor of the resistor based measuring circuit are connected in series, and wherein the current transformers of the different transformer based measuring circuits have different coil winding ratios and/or transformer cores having different magnetic properties.

This is indicated by the boxes in dashed lines in FIG. 6.

In step 310 a third amplifier 31 connected to the secondary coil 30b of the third transformer 30 measures and amplifies voltage pulses over the secondary coil 30b representing an alternating current component of the electrical current in the electrical conductor 2.

In step 320 a third Analog-to-Digital Converter 32 samples and converts the measured and amplified voltage pulses to a second digital signal representing the alternating current component of the electrical current in the electrical conductor 2.

In step 330 the third digital signal is transformed using a third inverter 33 configured to transform the third digital signal using a transfer function being an inverse of a transfer function representing the transformer based measuring circuit associated with the transformer 30.

This may of course be performed according to the method with more than two transformer based measuring circuits. In such a case there will be a plurality of separate lines of boxes wherein the act of transforming the second digital signal comprises transforming each of the plurality of second digital signals originating from the respective transformer based measuring circuits using a respective second inverter configured to transform the respective second digital signal using a transfer function being an inverse of a transfer function representing the respective transformer based measuring circuit; and wherein the act of combining comprises combining the transformed first digital signal and the transformed plurality of second digital signals, thereby providing a digital signal representing the electrical current in the electrical conductor.

It is contemplated that there are numerous modifications of the embodiments described herein, which are still within the scope of the invention as defined by the appended claims.

The measurement systems may for instance also be provided with filters, such as low pass filters 14.

In the embodiments shown in FIG. 2 and FIG. 3, there is one transformer based measuring circuit and two transformer based measuring circuits, respectively. It may however be noted that it is conceivable to have even more transformer based measuring circuits, such as three, four or even more.

The invention claimed is:

1. A device for measuring electrical current in an electrical conductor, the device comprising:
a measuring circuit configured to be connected to the electrical conductor, the measuring circuit comprising:
a resistor based measuring circuit comprising:
a resistor,
a first amplifier connected to the resistor for measuring and amplifying a voltage drop over the resistor corresponding to a direct current component of the electrical current in the electrical conductor, and
a first Analog-to-Digital Converter configured to sample and convert the measured and amplified voltage drop to a first digital signal representing the direct current component of the electrical current in the electrical conductor; and
a transformer based measuring circuit comprising:
a current transformer comprising a primary coil, connected in series with the resistor of the resistor based measuring circuit, and a secondary coil;
a second amplifier connected to the secondary coil for measuring and amplifying voltage pulses over the secondary coil representing an alternating current component of the electrical current in the electrical conductor, and
a second Analog-to-Digital Converter configured to sample and convert the measured and amplified voltage pulses to a second digital signal representing the alternating current component of the electrical current in the electrical conductor;
a first inverter configured to transform the first digital signal using a transfer function being an inverse of a transfer function representing the resistor based measuring circuit;
a second inverter configured to transform the second digital signal using a transfer function being an inverse of a transfer function representing the transformer based measuring circuits; and
a signal combiner configured to combine the transformed first and second digital signals, thereby providing a digital signal representing the electrical current in the electrical conductor.

2. The device according to claim 1, wherein the resistance in the resistor of the resistor based measuring circuit is within the range of 10 $\mu\Omega$-100 $\Omega$.

3. The device according to claim 1, wherein the second amplifier is a transimpedance amplifier.

4. The device according to claim 1, wherein the second amplifier is a non-inverting amplifier.

5. The device according to claim 1, wherein the measuring circuit comprises a plurality of transformer based measuring circuits, wherein the primary coils of the current transformers of the plurality of transformer based measuring circuits and the resistor of the resistor based measuring circuit are connected in series, and wherein the current transformers of the different transformer based measuring circuits have different coil winding ratios and/or transformer cores having different magnetic properties.

6. A method for measuring electrical current in an electrical conductor, the method comprising:
connecting a measuring circuit to the electrical conductor, the measuring circuit comprising a resistor based measuring circuit and a transformer based measuring circuit,
wherein the resistor based measuring circuit comprises a resistor, a first amplifier connected to the resistor for measuring and amplifying a voltage drop over the resistor corresponding to a direct current component of the electrical current in the electrical conductor, and a first Analog-to-Digital Converter configured to sample and convert the measured and amplified voltage drop to a first digital signal representing the direct current component of the electrical current in the electrical conductor,
wherein the transformer based measuring circuit comprises a current transformer comprising a primary coil, connected in series with the resistor of the resistor based measuring circuit, and a secondary coil, a second amplifier connected to the secondary coil for measuring and amplifying voltage pulses over the secondary coil representing an alternating current component of the electrical current in the electrical conductor, and a second Analog-to-Digital Converter configured to sample and convert the measured and amplified voltage pulses to a second digital signal representing the alternating current component of the electrical current in the electrical conductor, transforming the first digital signal using a first inverter configured to transform the first digital signal using a transfer function being an inverse of a transfer function representing the resistor based measuring circuit;

transforming the second digital signal using a second inverter configured to transform the second digital signal using a transfer function being an inverse of a transfer function representing the transformer based measuring circuit;

combining the transformed first and second digital signals, thereby providing a digital signal representing the electrical current in the electrical conductor.

7. The method according to claim 6, wherein the measuring circuit comprises a plurality of transformer based measuring circuits, wherein the primary coils of the current transformers of the plurality of transformer based measuring circuits and the resistor of the resistor based measuring circuit are connected in series, and wherein the current transformers of the different transformer based measuring circuits have different coil winding ratios and/or transformer cores having different magnetic properties;

wherein the act of transforming the second digital signal comprises transforming each of the plurality of second digital signals originating from the respective transformer based measuring circuits using a respective second inverter configured to transform the respective second digital signal using a transfer function being an inverse of a transfer function representing the respective transformer based measuring circuit; and wherein the act of combining comprises combining the transformed first digital signal and the transformed plurality of second digital signals, thereby providing a digital signal representing the electrical current in the electrical conductor.

8. The device according to claim 1, wherein the resistance in the resistor of the resistor based measuring circuit is within the range of $10\mu\Omega$-$10\Omega$.

* * * * *